United States Patent
Alghouli

(10) Patent No.: US 7,009,413 B1
(45) Date of Patent: Mar. 7, 2006

(54) SYSTEM AND METHOD FOR TESTING BALL GRID ARRAYS

(75) Inventor: Muwaffaq Alghouli, Tustin, CA (US)

(73) Assignee: QLOGIC Corporation, Aliso Viejo, CA (US)

( * ) Notice: Subject to any disclaimer, the term of this patent is extended or adjusted under 35 U.S.C. 154(b) by 0 days.

(21) Appl. No.: 10/683,622

(22) Filed: Oct. 10, 2003

(51) Int. Cl.
*G01R 31/02* (2006.01)

(52) U.S. Cl. .................. 324/755; 324/765; 324/762

(58) Field of Classification Search ........ 324/754–765; 439/66–74, 90
See application file for complete search history.

(56) References Cited

U.S. PATENT DOCUMENTS 6,246,249 B1 * 6/2001 Fukasawa et al. .......... 324/765
6,249,135 B1 * 6/2001 Maruyama et al. ......... 324/765
6,373,267 B1 * 4/2002 Hiroi ........................... 324/754
6,517,362 B1 * 2/2003 Hirai et al. ................... 439/82

* cited by examiner

*Primary Examiner*—Vinh P. Nguyen
(74) *Attorney, Agent, or Firm*—Klein, O'Neill & Singh, LLP

(57) ABSTRACT

An apparatus for testing ball grid arrays ("BGAs") is provided. The apparatus includes, a socket slot in a printed circuit board for holding a socket used for testing the BGAs; and plural holding members that support BGA solder balls. The socket top may have plural prong like holding members; plural circular holding members; and/or plural spiral holding members for supporting the solder balls. The holding members may be etched on a BGA socket top and are flexible, rigid and/or semi-rigid to provide support for the solder balls.

4 Claims, 4 Drawing Sheets

BGA SOCKET TOP

BGA SOCKET TOP

BGA SOCKET TOP

SYSTEM AND METHOD FOR TESTING BALL GRID ARRAYS

BACKGROUND OF THE INVENTION

1. Field of the Invention

The present invention relates to ball grid array packages, and more particularly, to an apparatus for testing ball grid array packages.

2. Background

Ball Grid Array (BGA) packages reduce semi-conductor package size and pin-to-pin trace gap by integrating more functions and reliability in a single chip. BGA technology is a cross between a pin grid array and a surface mount device. It is similar to a pin grid array except that solder balls attached to a land on the package replace pins. Input/Output (I/O) counts range from 16 to 2400, with the most common falling between 200 and 500 pins. The absence of leads makes BGA a robust packaging option, which increases manufacturing yield.

BGAs are typically tested using test sockets in complicated assemblies. One such assembly is sold by Yamaichi Electronics®, Part Number NP276. This assembly is complex, expensive and cumbersome because it includes springs, and various other components. Also, the socket is soldered to the assembly to receive the BGA for testing, which adds cost to the overall testing process.

Therefore, there is need for a method and system for efficiently testing BGA packages.

SUMMARY OF THE INVENTION

An apparatus for testing ball grid arrays ("BGAs") is provided. The apparatus includes, a socket slot in a printed circuit board for holding a socket used for testing the BGAs; and plural holding members that support BGA solder balls.

The socket top may have plural prong like holding members; plural circular holding members; and/or plural spiral holding members for supporting the solder balls. The holding members may be etched on a BGA socket top and are flexible, rigid and/or semi-rigid to provide support for the solder balls.

In one aspect of the present invention, since BGA testing sockets are placed in a PCB, complex holding mechanisms are not required. Also, PCB sockets can be mass produced and that lowers the overall cost of BGA testing. Furthermore, the apparatus of the present invention is more versatile, since various shapes can be used to hold solder balls for BGA testing.

This summary has been provided so that the nature of the invention may be understood quickly. A more complete understanding of the invention can be obtained by reference to the following detailed description of the preferred embodiments thereof concerning the attached drawings.

BRIEF DESCRIPTION OF THE DRAWINGS

The foregoing features and other features of the present invention will now be described with reference to the drawings of a preferred embodiment. In the drawings, the same components have the same numerals. The illustrated embodiment is intended to illustrate, but not to limit the invention. The drawings include the following figures.

DETAILED DESCRIPTION OF THE PREFERRED EMBODIMENTS

Figure 1A:
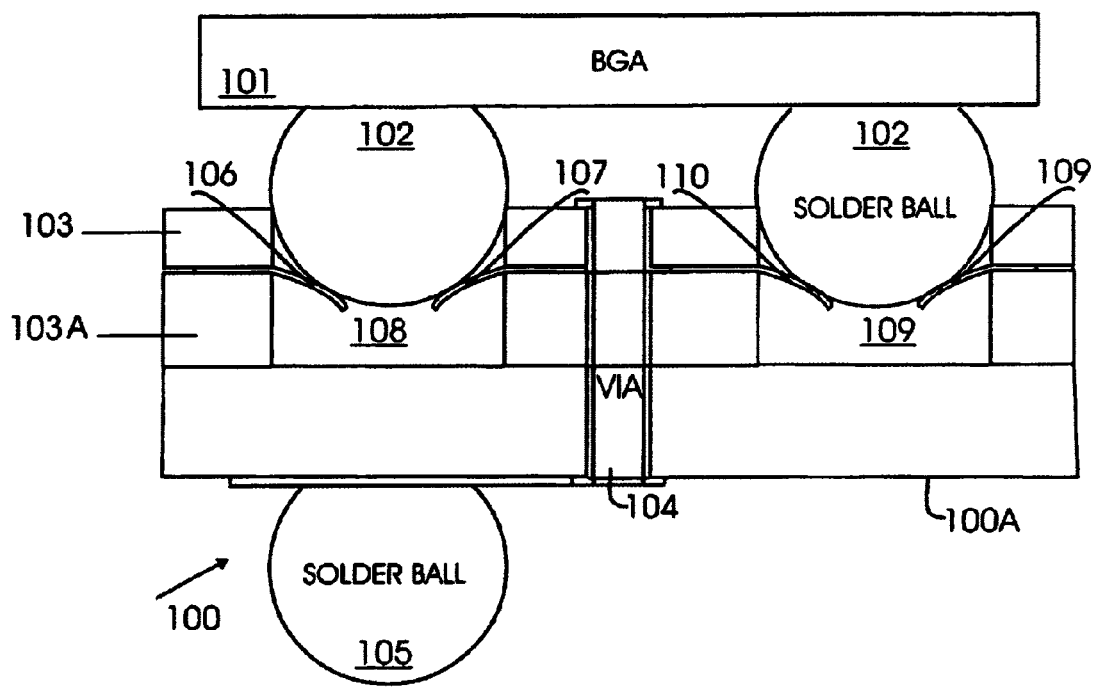
FIGS. 1A–1C shows an apparatus for BGA testing, according to one aspect of the present invention.

FIG. 1A shows a schematic of an apparatus for testing BGAs without using complex components, according to one aspect of the present invention. Apparatus 100 includes a printed circuit board 100A which has a socket 103. Socket 103 receives BGA 101 solder balls 102. Supporting members (also referred to herein as ("holding members")) 106, 107, 109 and 110 are able to support solder balls 102 for tesing. Holding members 106, 107, 109 and 110 are flexible, semi rigid or rigid to provide support for the solder balls.

Via 104 provides connection between BGA 101 and solder ball 105 that is coupled to a testing module.

It is noteworthy that since apparatus 100 is made out of a PCB, it does not require complex componets. Also, apparatus 100 can be mass produced, reducing the overall costs for sockets.

Figure 1B:
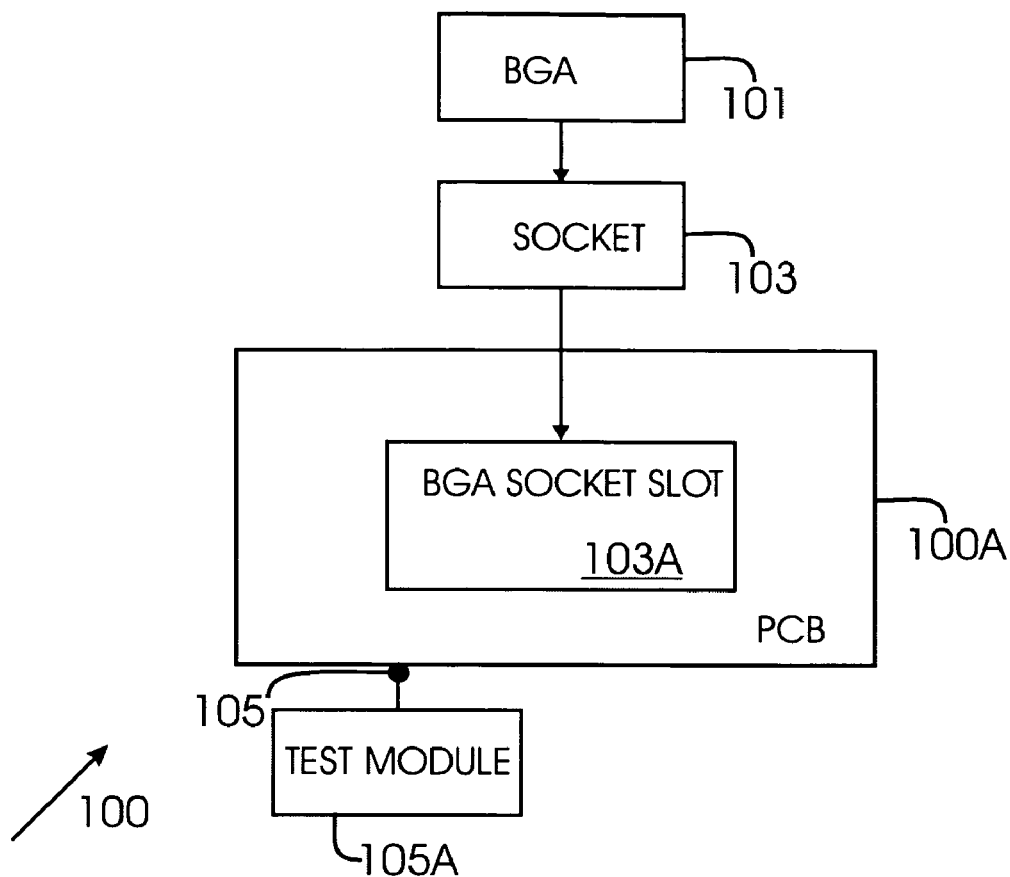

FIG. 1B shows a simplified block diagram of apparatus 100. BGA 101 is placed on socket 103, which is then placed in slot 103A. Slot 103A is located in PCB 10A. BGA 101 can be tested using solder ball 105 which is operationally coupled to a test module 105A.

Figure 1C:
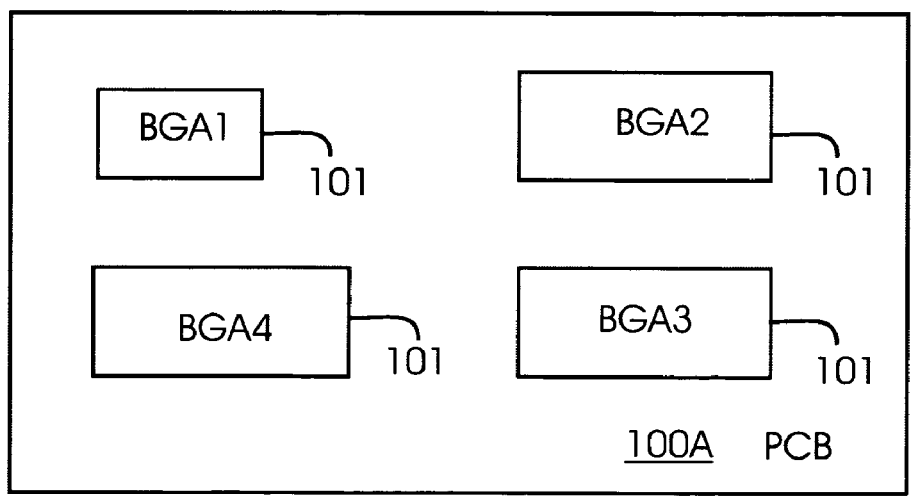

FIG. 1C shows yet another aspect of the present invention, where plural sockets are placed on the same PCB 100A for testing plural BGAs 101. Again, PCB 100A with the socket slots can be mass produced and make the overall testing process efficient.

Figure 2:
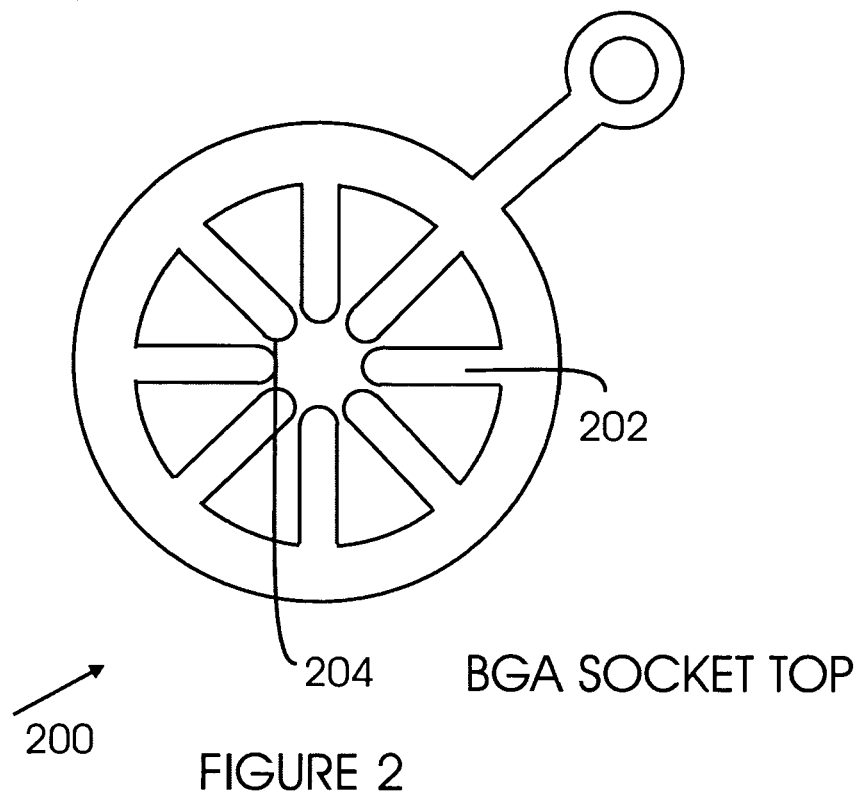
FIGS. 2–4 shows various BGA socket top shapes that may be used for BGA testing, according to one aspect of the present invention
Figure 3:
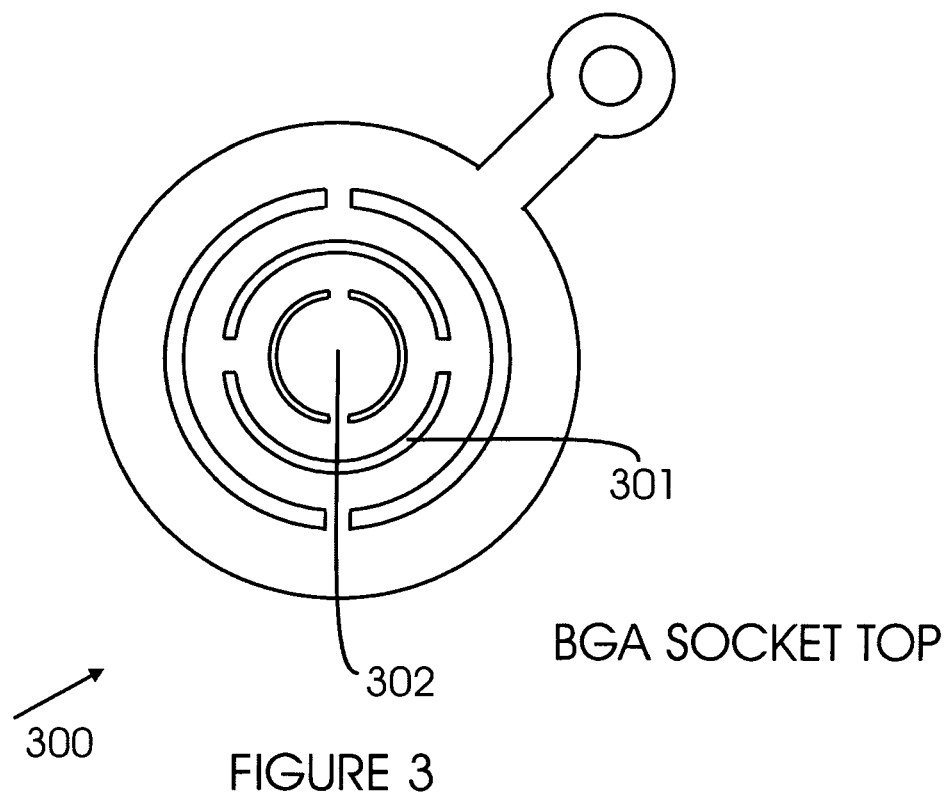
Figure 4:
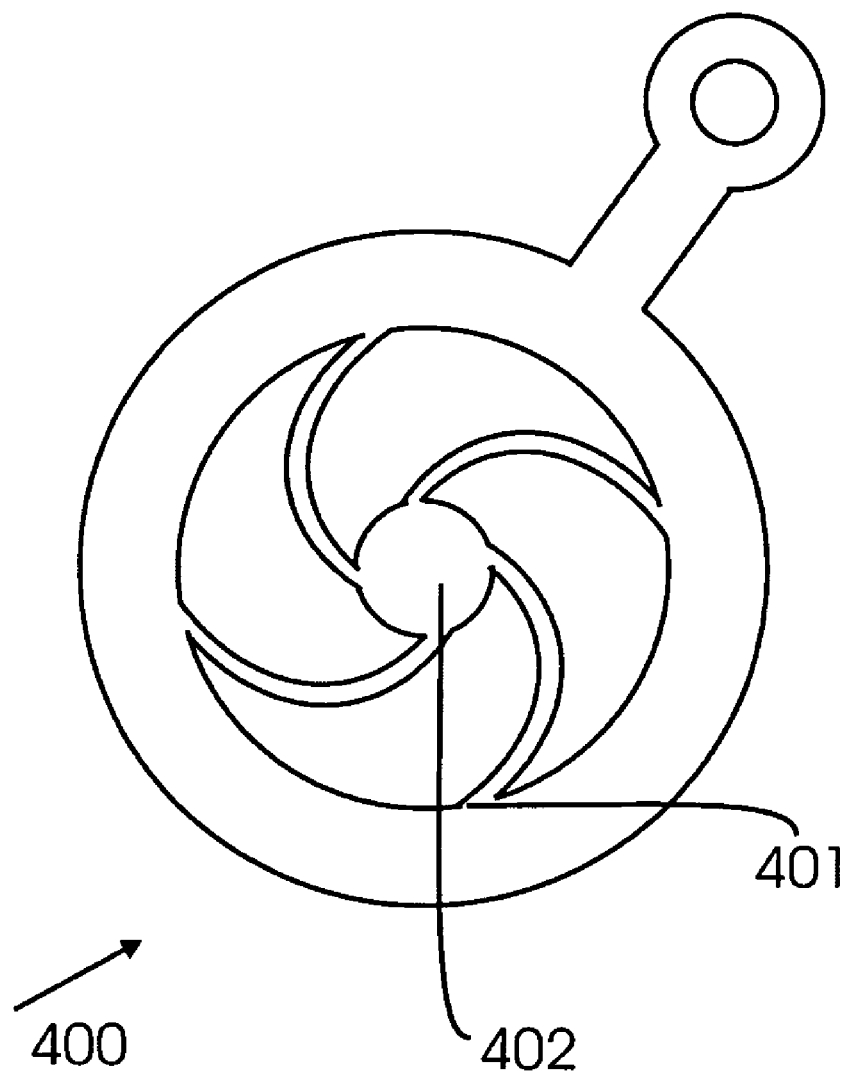

The BGA socket top 103 may be of various shapes and forms. FIGS. 2–4 show examples of some of the shapes/form that may be used for BGA testing. It is noteworthy that the adaptive aspects of the present invention are not limited to any particular shape and/or form.

FIG. 2 shows a BGA socket top 200 with holding members (shaped as fingers or prongs) 202 and opening 201 that can hold solder balls 102. Holding members 202 (or holding members 202) may be etched.

FIG. 3 shows a BGA socket top 300 with circular holding members 301 and opening 302. Again holding members 301 may be etched and help to support solder balls 102 in opening 302.

FIG. 4 shows yet another example of a BGA socket top 400. In this example, holding members 401 are spiral in shape. BGA solder balls 102 are placed in opening 402 and supported by members 401. Again spiral members 401 may be etched.

In one aspect of the present invention, since BGA testing sockets are placed in a PCB, complex holding mechanisms are not required. Also, PCB sockets can be mass produced and that lowers the overall cost of BGA testing. Furthermore, the apparatus of the present invention is more versatile, since various shapes can be used to hold solder balls for BGA testing.

Although the present invention has been described with reference to specific embodiments, these embodiments are illustrative only and not limiting. Many other applications and embodiments of the present invention will be apparent in light of this disclosure and the following claims. The invention is intended to cover various modifications and equivalent arrangements within the spirit and scope of the appended claims.

What is claimed is:

1. An apparatus for testing ball grid arrays ("BGAs") comprising:

a socket slot in a printed circuit board for receiving a socket that is used for supporting BGAs solder balls, wherein the BGA solder balls are supported by plural holding members of the socket; and a via through the printed circuit board connects the BGA solder balls to a solder ball at one end of the printed circuit board, wherein the solder ball at the end of the printed circuit board is connected to a testing module used for testing the BGAs.

2. The apparatus of claim 1, wherein the plural holding members for supporting the solder balls are prong shaped.

3. The apparatus of claim 1, wherein the holding members are etched on a socket top.

4. The apparatus of claim 1, wherein the plural holding members are flexible, rigid and/or semi-rigid to provide support for the solder balls.

* * * * *

UNITED STATES PATENT AND TRADEMARK OFFICE
CERTIFICATE OF CORRECTION

| | | |
|---|---|---|
| PATENT NO. | : 7,009,413 B1 | Page 1 of 1 |
| APPLICATION NO. | : 10/683622 | |
| DATED | : March 7, 2006 | |
| INVENTOR(S) | : Muwaffaq Alghouli | |

It is certified that error appears in the above-identified patent and that said Letters Patent is hereby corrected as shown below:

On the Title page, in field (54), in column 1, in Title, line 1, delete "METHOD" and insert -- APPARATUS --, therefor.

In column 1, line 1, delete "METHOD" and insert -- APPARATUS --, therefor.

In column 2, line 25, delete "10A." and insert -- 100A. --, therefor.

In column 3, line 5, in claim 1, delete "BGAs" and insert -- BGA --, therefor.

Signed and Sealed this

Twelfth Day of October, 2010

David J. Kappos
*Director of the United States Patent and Trademark Office*